(12) United States Patent
Lim

(10) Patent No.: US 10,892,205 B2
(45) Date of Patent: Jan. 12, 2021

(54) PACKAGE STRUCTURE AND POWER MODULE USING SAME

(71) Applicant: Delta Electronics Int'l (Singapore) Pte Ltd, Singapore (SG)

(72) Inventor: Beng Beng Lim, Singapore (SG)

(73) Assignee: DELTA ELECTRONICS INT'L (SINGAPORE) PTE LTD, Singapore (SG)

( * ) Notice: Subject to any disclaimer, the term of this patent is extended or adjusted under 35 U.S.C. 154(b) by 0 days.

(21) Appl. No.: 16/275,131

(22) Filed: Feb. 13, 2019

(65) Prior Publication Data

US 2020/0176348 A1    Jun. 4, 2020

(30) Foreign Application Priority Data

Nov. 30, 2018  (SG) .............................. 10201810791

(51) Int. Cl.
| | |
|---|---|
| *H01L 23/36* | (2006.01) |
| *H01L 23/367* | (2006.01) |
| *H01L 23/538* | (2006.01) |
| *H01L 23/433* | (2006.01) |
| *H01L 23/31* | (2006.01) |

(52) U.S. Cl.
CPC ...... *H01L 23/3672* (2013.01); *H01L 23/3107* (2013.01); *H01L 23/4334* (2013.01); *H01L 23/5383* (2013.01); *H01L 23/5384* (2013.01); *H01L 23/5389* (2013.01)

(58) Field of Classification Search
CPC ............ H01L 23/3672; H01L 23/3107; H01L 23/4334; H01L 23/5383; H01L 23/5384; H01L 23/5389
See application file for complete search history.

(56) References Cited

U.S. PATENT DOCUMENTS

| | | | | |
|---|---|---|---|---|
| 2009/0116197 | A1* | 5/2009 | Funakoshi | .......... H01L 21/4882 361/719 |
| 2009/0129026 | A1* | 5/2009 | Baek | ................... H01L 23/4093 361/710 |
| 2010/0238627 | A1* | 9/2010 | Shinohara | ........... H01L 23/3107 361/695 |
| 2013/0050947 | A1* | 2/2013 | Kadoguchi | ......... H01L 23/4334 361/715 |

(Continued)

*Primary Examiner* — Peter Bradford
(74) *Attorney, Agent, or Firm* — Kirton McConkie; Evan R. Witt

(57) ABSTRACT

A package structure includes a first insulation layer, a first redistribution structure, at least one electronic component, a second redistribution structure, a second insulation layer, a first heat spreader, a heat dissipation substrate, a second heat spreader and plural thermal conduction structures. A part of the second redistribution structure is disposed on a part of a top surface of the first insulation layer, and the other part of the second redistribution is located in the first insulation layer. At least one of the conducting terminals is connected with the second redistribution structure. At least one of the thermal conduction structures is connected with at least one of the first redistribution structure and the second redistribution structure, and the thermal conduction structures are respectively extended outwardly from the opposite sides of the first insulation layer to form pins.

20 Claims, 6 Drawing Sheets

(56) References Cited

U.S. PATENT DOCUMENTS

| | | | |
|---|---|---|---|
| 2013/0285229 A1* | 10/2013 | Stella | H01L 23/3677 257/692 |
| 2014/0159216 A1* | 6/2014 | Ishino | H01L 23/3114 257/675 |
| 2015/0348865 A1* | 12/2015 | Vincent | H01L 24/03 257/712 |
| 2016/0064308 A1* | 3/2016 | Yamada | H01L 23/49811 257/697 |
| 2016/0181175 A1* | 6/2016 | Ikeda | H01L 23/051 257/687 |
| 2019/0172802 A1* | 6/2019 | Chen | H01L 23/3121 |
| 2019/0341327 A1* | 11/2019 | Teysseyre | H01L 23/473 |

* cited by examiner

PACKAGE STRUCTURE AND POWER MODULE USING SAME

FIELD OF THE INVENTION

The present disclosure relates to a package structure, and more particularly to a package structure and a power module capable of enhancing the heat dissipating efficiency and reducing the thickness.

BACKGROUND OF THE INVENTION

Recently, the general trends in designing electronic devices are toward small size, light weightiness and easy portability. Moreover, with the increasing development of electronic industries, the internal circuitries of the electronic devices are gradually modularized. In other words, plural electronic components are integrated into a single circuit module. For example, a power module is one of the widely-used circuit modules. An example of the power module includes a DC-to-DC converter, a DC-to-AC converter, an AC-to-DC converter, or the like. After the electronic components (e.g. capacitors, resistors, inductors, transformers, diodes, transistors and etc.) are integrated as a power module, the power module may be installed on a motherboard or a system circuit board.

However, the conventional package structure of the power module often has poor heat dissipating efficiency when the electronic component embedded within an insulation layer of the conventional package structure of the power module generates a great amount of heat during working. Moreover, since the electronic component of the conventional package structure of the power module utilizes the wire-bonded technology to connect with other electronic components or pins, some drawbacks occur. For example, the long wires for connecting the electronic components may increase the parasitic effect. Under this circumstance, the efficiency of the electronic components will be adversely affected. Besides, the space utilization within the conventional package structure is also limited so that the thickness of the conventional package structure cannot be reduced since it is necessary to retain a wire-bonded area in the conventional package structure. Under the above circumstances, the conventional package structure is difficult to increase the power density to be applicable to the power module with high power. Therefore, there is a need of providing a package structure and a power module using the same to address the issues encountered by the prior arts.

SUMMARY OF THE INVENTION

An object of the present disclosure is to provide a package structure including a first insulation layer, a first redistribution structure, at least one electronic component embedded within the first insulation layer, a second redistribution structure, and thermal conduction structures, wherein at least one of the plural conducting terminals of the electronic component is connected with the second redistribution structure, and at least one of the thermal conduction structures is connected with at least one of the first redistribution structure and the second redistribution structure. Consequently, the package structure may enhance the heat dissipating efficiency, and the thickness of the package structure may be reduced. Therefore, the package structure is applicable to the power module with high power.

Another object of the present disclosure is to provide a package structure including the thermal conduction structures, wherein the thermal conduction structures are respectively exposed from the opposite sides of the first insulation layer to form pins. Consequently, the package structure may enhance the heat dissipating efficiency by the thermal conduction structures, and the package structure may be combined with a printed circuit board by pings to form a power module.

In accordance with an aspect of the present disclosure, there is provided a package structure. The package structure includes a first insulation layer, a first redistribution structure, at least one electronic component, a second redistribution structure, a second insulation layer, a first heat spreader, a heat dissipation substrate, a second heat spreader and plural thermal conduction structures. The first redistribution structure is located in the first insulation layer and is exposed from a bottom surface of the first insulation layer. A part of the second redistribution structure is disposed on a part of a top surface of the first insulation layer, and the other part of the second redistribution structure is located in the first insulation layer. The at least one electronic component is embedded within the first insulation layer and disposed on the first redistribution structure, and includes plural conducting terminals, wherein at least one of the conducting terminals is connected with the second redistribution structure. The second insulation layer is disposed on the other part of the top surface of the first insulating layer and the second redistribution structure. The first heat spreader is disposed on the second insulation layer. The heat dissipation substrate is disposed on the bottom surface of the first insulation layer, and a second heat spreader is disposed on the heat dissipation substrate. The thermal conduction structures are embedded within the first insulation layer, wherein at least one of plural the thermal conduction structures is connected with at least one of the first redistribution structure and the second redistribution structure, and the plural thermal conduction structures are respectively exposed from the opposite sides of the first insulation layer to form pins.

In accordance with another aspect of the present disclosure, there is provided a power module. The power module includes at least one printed circuit board and at least one package structure. The at least one package structure includes a first insulation layer, a first redistribution structure, at least one electronic component, a second redistribution structure, a second insulation layer, a first heat spreader, a heat dissipation substrate, a second heat spreader, and plural thermal conduction structures. The first redistribution structure is located in the first insulation layer and exposed from a bottom surface of the first insulation layer. A part of the second redistribution structure is disposed on a part of a top surface of the first insulation layer, and the other part of the second redistribution structure is located in the first insulation layer. The at least one electronic component is embedded within the first insulation layer and disposed on the first redistribution structure, and includes plural conducting terminals, wherein at least one of the plural conducting terminals is connected with the second redistribution structure. The second insulation layer is disposed on the other part of the top surface of the first insulating layer and the second redistribution structure. The first heat spreader is disposed on the second insulation layer. The heat dissipation substrate is disposed on the bottom surface of the first insulation layer, and a second heat spreader is disposed on the heat dissipation substrate. The plural thermal conduction structures are embedded within the first insulation layer, wherein at least one of the plural thermal conduction structures is connected with at least one of the first redistribution structure and the second redistribution structure, and the plural thermal conduction structures are respectively exposed outwardly from the opposite sides of the first insulation layer to form plural pins to be inserted into the at least one printed circuit board.

The above contents of the present disclosure will become more readily apparent to those ordinarily skilled in the art after reviewing the following detailed description and accompanying drawings, in which:

DETAILED DESCRIPTION OF THE PREFERRED EMBODIMENT

Figure 1:
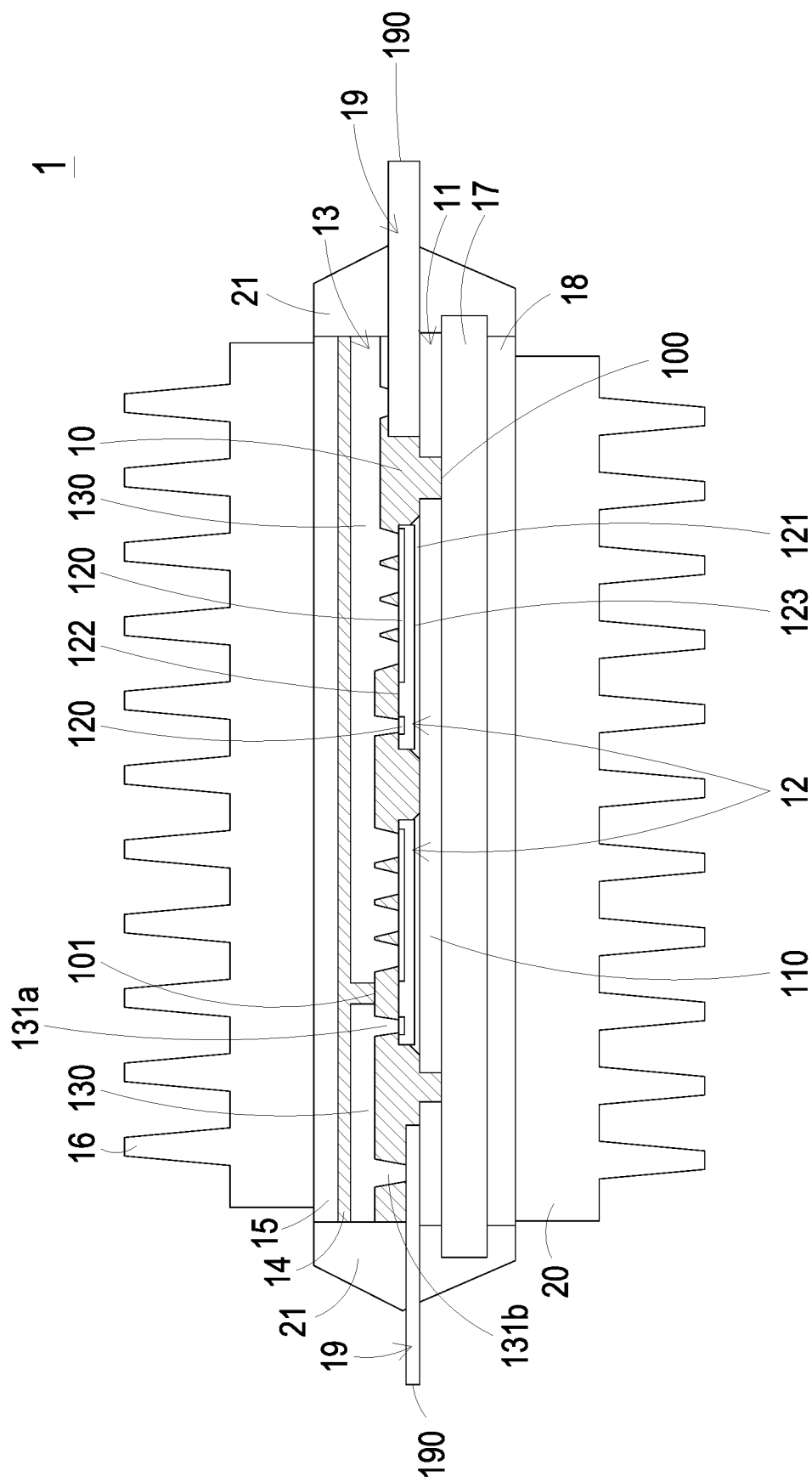
FIG. 1 is a schematic cross-sectional view illustrating a package structure according to a first embodiment of the present disclosure.

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When an element is referred to as being "connected," or "coupled," to another element, it can be directly connected or coupled to the other element or intervening elements may be present. Although the wide numerical ranges and parameters of the present disclosure are approximations, numerical values are set forth in the specific examples as precisely as possible. In addition, although the "first," "second," "third," and the like terms in the claims be used to describe the various elements can be appreciated, these elements should not be limited by these terms, and these elements are described in the respective embodiments are used to express the different reference numerals, these terms are only used to distinguish one element from another element. For example, a first element could be termed a second element, and, similarly, a second element could be termed a first element, without departing from the scope of example embodiments. Besides, "and/or" and the like may be used herein for including any or all combinations of one or more of the associated listed items. While the numerical ranges and parameters set forth for the broad scope of the present invention are approximations, the numerical value reported in the specific examples set forth as accurately as possible. However, any numerical values inherently contain certain errors necessarily the standard deviation found in the respective testing measurements caused. Also, as used herein, the term "about" generally means away from a given value or a range of 10%, 5%, 1% or 0.5%. Alternatively, the word "about" means within an acceptable standard error of ordinary skill in the art-recognized average. In addition to the operation/working examples, or unless otherwise specifically stated otherwise, in all cases, all of the numerical ranges, amounts, values and percentages, such as the number for the herein disclosed materials, time duration, temperature, operating conditions, the ratio of the amount, and the like, should be understood as the word "about" decorator. Accordingly, unless otherwise indicated, the numerical parameters of the present invention and scope of the appended patent proposed is to follow changes in the desired approximations. At least, the number of significant digits for each numerical parameter should at least be reported and explained by conventional rounding technique is applied. Herein, it can be expressed as a range between from one endpoint to the other or both endpoints. Unless otherwise specified, all ranges disclosed herein are inclusive.

FIG. 1 is a schematic cross-sectional view illustrating a package structure according to a first embodiment of the present disclosure. As shown in FIG. 1, the package structure 1 includes a first insulation layer 10, a first redistribution structure 11, at least one electronic component 12, a second redistribution structure 13, a second insulation layer 14, a first heat spreader 15, a first heat dissipation device 16, a heat dissipation substrate 17, a second heat spreader 18, and plural thermal conduction structures 19. In this embodiment, preferably but not exclusively, the package structure 1 includes two thermal conduction structures 19. The first insulation layer 10 may be made of any appropriate insulation material with high thermal conductivity.

The first redistribution structure 11 may be made of any metal material with high thermal conductivity, such as copper. The first redistribution structure 11 includes at least one first redistribution layer 110 located in the first insulation layer 10 and is exposed from a bottom surface 100 of the first insulation layer 10.

In this embodiment, preferably but not exclusively, the package structure 1 includes two electronic components 12. At least one of the electronic components 12 may include an active component. In the embodiment, each of the electronic components 12 includes an active component, for example but not limited to a Wide Band Gap power semiconductor device including at least one of gallium nitride (GaN) and silicon carbide (SiC) capable of operating in high frequency. The electronic components 12 are embedded within the first insulation layer 10 and include plural conducting terminals 120. Each of the electronic components 12 is attached on the corresponding first redistribution layer 110 through a fixing material 121. An example of the fixing material 121 includes but is not limited to a silver sintering material.

In some embodiments, as shown in FIG. 1, the electronic component 12 further includes a first surface 122 adjacent to a top surface 101 of the first insulation layer 10 and a second surface 123 opposite to the first surface 122 and adjacent to the bottom surface 100 of the first insulation layer 10. In addition, the electronic component 12 may include a lateral type electronic component (or called a first electronic component). In other words, the plural conducting terminals 120 of the lateral type electronic component 12 are formed on the first surface 122 of the electronic component 12. In one embodiment, the electronic component 12 includes a Wide Band Gap power semiconductor device of the lateral type electronic component.

A part of the second redistribution structure 13 is disposed on a part of the top surface 101 of the first insulation layer 10, and the other part of the second redistribution structure 13 is located in the first insulation layer 10. In this embodiment, each of the conducting terminals 120 of the electronic component 12 is electrically connected with the second redistribution structure 13.

The second insulation layer 14 may be made of any appropriate insulation material with high thermal conductivity. The second insulation layer 14 is disposed on the other part of the top surface 101 of the first insulating layer 10 and the second redistribution structure 13.

The first heat spreader 15 may be made of any metallic material with high thermal conductivity, such as copper. The first heat spreader 15 is disposed on the second insulation layer 14. Consequently, the heat dissipating efficacy of the package structure 1 may be enhanced by the first heat spreader 15.

The first heat dissipation device 16 is disposed on the first heat spreader 15 and thermally coupled with the first heat spreader 15 for enhancing the heat dissipating efficiency of the package structure 1. In one embodiment, the first heat dissipation device 16 is thermally coupled with the first heat spreader 15 directly for further enhancing the heat dissipating efficiency of the package structure 1. The first heat dissipation device 16 may include at least one of a passive heat dissipation device and an active heat dissipation device. An example of the passive heat dissipation device includes but not limited to a heat sink made of at least one of metallic material and ceramic material. An example of the active heat dissipation device includes but not limited to at least one of a heat pipe and a water-cooling device. In some embodiments, the first heat dissipation device 16 may be fixed on the first heat spreader 15 by heat conduction glue (not shown in FIG. 1).

The heat dissipation substrate 17 is disposed on the bottom surface 100 of the first insulation layer 10. Preferably but not exclusively, the heat dissipation substrate 17 may include a substrate adapted to direct bond copper (DBC) processes. In one embodiment, the heat dissipation substrate 17 may include a ceramic base. The second heat spreader 18 may be made of any metallic material with high thermal conductivity, such as copper. The second heat spreader 18 is disposed on the heat dissipation substrate 17 and opposite to the first redistribution structure 11. Consequently, the heat dissipating efficacy of the package structure 1 will be enhanced by the second heat spreader 18.

Two thermal conduction structures 19 are embedded within the first insulation layer 10 and respectively located at opposite sides of the first insulation layer 10. Besides, the two thermal conduction structures 19 may be disposed on the corresponding first redistribution layer 110 respectively. Each of the two thermal conduction structures 19 is connected with the second redistribution structure 13, so that each of the two thermal conduction structures 19 may be connected with at least one corresponding conducting terminal 120 of the at least one the electronic component 12 via the second redistribution structure 13. Moreover, the two thermal conduction structures 19 are respectively exposed from the opposite sides of the first insulation layer 10 to form pins 190. In other words, the pins 190 are extended outwardly from the first insulation layer 10.

In an embodiment, the two thermal conduction structures 19 are made of metallic material. Moreover, the two thermal conduction structures 19 may be implemented with the same lead frame or two different lead frames. Consequently, two thermal conduction structures 19 have thermally conductive property and electrically conductive property.

In one embodiment, the package structure 1 includes a first insulation layer 10, plural electronic components 12, a second redistribution structure 13, a second insulation layer 14, a first heat spreader 15, a first heat dissipation device 16, plural thermal conduction structures 19, and a DBC substrate including a first redistribution structure 11, a second heat spreader 18, and a heat dissipation substrate 17 disposed between the first redistribution structure 11 and the second heat spreader 18. The first redistribution structure 11 of the DBC substrate includes at least one first redistribution layer 110 and is located in the first insulation layer 10 and is exposed from a bottom surface 100 of the first insulation layer 10. A part of the second redistribution structure 13 is disposed on a part of a top surface 101 of the first insulation layer 10, and the other part of the second redistribution structure 13 is located in the first insulation layer 10. The plural electronic components 12 include at least one of a lateral type electronic component including plural conducting terminals 120 formed on a first surface 122 of the electronic component 12 and are embedded within the first insulation layer 10 and attached on the first redistribution structure 11 of the DBC substrate via a second surface 123 opposite to the first surface 122. The conducting terminals 120 of the lateral type electronic component 12 are electrically connected with the second redistribution structure 13. The second insulation layer 14 is disposed on the other part of the top surface 101 of the first insulating layer 10 and the second redistribution structure 13. The first heat spreader 15 with high thermal conductivity is disposed on the second insulation layer 14. The first heat dissipation device 16 is disposed on the first heat spreader 15 and thermally coupled with the first heat spreader 15 for enhancing the heat dissipating efficiency of the package structure 1. The plural thermal conduction structures 19 are embedded within the first insulation layer 10, wherein at least one of the plural thermal conduction structures 19 is connected with at least one of the DBC substrate and the second redistribution structure 13, and the plural thermal conduction structures 19 are respectively exposed from the opposite sides of the first insulation layer 10 to form plural pins.

As mentioned of the above embodiments, since the first insulation layer 10, the first redistribution structure 11, the second redistribution structure 13, the second insulation layer 14, and the heat dissipation substrate 17 respectively have high thermal conductivity, and the package structure 1 further includes the first heat spreader 15, the first heat dissipation device 16, and the second heat spreader 18, even if the electronic components 12 generate a great amount of heat during working, the heat generated by the electronic components 12 may be rapidly dissipated to the surroundings of the package structure 1 in the vertical direction. Besides, a part of the heat generated by the electronic components 12 also may be rapidly and bilaterally dissipated to the surroundings of the package structure 1 by the second redistribution structure 13 and the thermal conduction structures 19. Consequently, the package structure with dual side cooling function is provided and the heat dissipating efficacy of the package structure 1 is enhanced. Besides, in the embodiments, since the plural conducting terminals 120 of the electronic component 12 are connected with the corresponding thermal conduction structure 19 by the second redistribution structure 13 without utilizing the wire-bonded technology, the parasitic effect is reduced so as to enhance the efficiency of the electronic components 12, and the thickness of the package structure 1 also may be reduced. Therefore, the package structure 1 may increase the power density to be applicable to the power module with high power.

In some embodiments, the package structure 1 further includes a second heat dissipation device 20. The second heat dissipation device 20 is disposed on the second heat spreader 18 and opposite to the heat dissipation substrate 17 for further enhancing the heat dissipating efficiency of the package structure 1. The second first heat dissipation device 20 may include at least one of a passive heat dissipation device and an active heat dissipation device. An example of the passive heat dissipation device includes but not limited to a heat sink made of at least one of metallic material and ceramic material. An example of the active heat dissipation device includes but not limited to at least one of a heat pipe and a water-cooling device. In some embodiments, the second heat dissipation device 20 may be fixed on the second heat spreader 18 by heat conduction glue (not shown in FIG. 1).

In some embodiments, the package structure 1 further includes a molding element 21. The molding element 21 surrounds the first insulation layer 10, the first redistribution structure 11, the second redistribution structure 13, the second insulation layer 14, the first heat spreader 15, the heat dissipation substrate 17, and the second heat spreader 18 to package a part of the first insulation layer 10, a part of the first insulation layer 10, a part of the first redistribution structure 11, a part of the second redistribution structure 13, a part of the second insulation layer 14, a part of the first heat spreader 15, a part of the heat dissipation substrate 17, and a part of the second heat spreader 18. The pins 190 of the thermal conduction structures 19 are respectively extended outwardly from the molding element 21. In this embodiment, the molding element 21 is mad of a molding compound.

In some embodiments, the second redistribution structure 13 includes at least one second redistribution layer 130, at least one first conductive via 131a, and at least one second conductive via 131b. The at least one second redistribution layer 130 is disposed on a part of the top surface 101 of the first insulation layer 10. Besides, the at least one first conductive via 131a and the at least one second conductive via 131b are formed in the first insulation layer 10, wherein the at least one first conductive via 131a is in contact with the corresponding second redistribution layer 130 and connected with the corresponding conducting terminal 120 of the electronic component 12, and the at least one second conductive via 131b is in contact with the corresponding second redistribution layer 130 and connected with the corresponding thermal conduction structure 19. Accordingly, each of the thermal conduction structures 19 is electrically connected with the at least one of the conducting terminals 120 of the at least one electronic component 12 through the first conductive via 131a, the second conductive via 131b, and the second redistribution layer 130 of the second redistribution structure 13.

In some embodiments, one of the two thermal conduction structures 19 is thinner than the other of the two thermal conduction structures 19. In one embodiment, the thinner one of the thermal conduction structures 19 is adapted to be a signal path. The thinner one of the thermal conduction structures 19 is adapted to receive an external control signal and/or transmit the external control signal to the corresponding conducting terminal 120 of the electronic component 12. In addition, in one embodiment, the thicker one of the thermal conduction structures 19 is adapted to be at least one of a high current path and a high voltage path. The thicker one of the thermal conduction structures 19 is adapted to transmit a high current and/or a high voltage. Alternatively, the two thermal conduction structures 19 may have the same structures and thicknesses.

Figure 2:
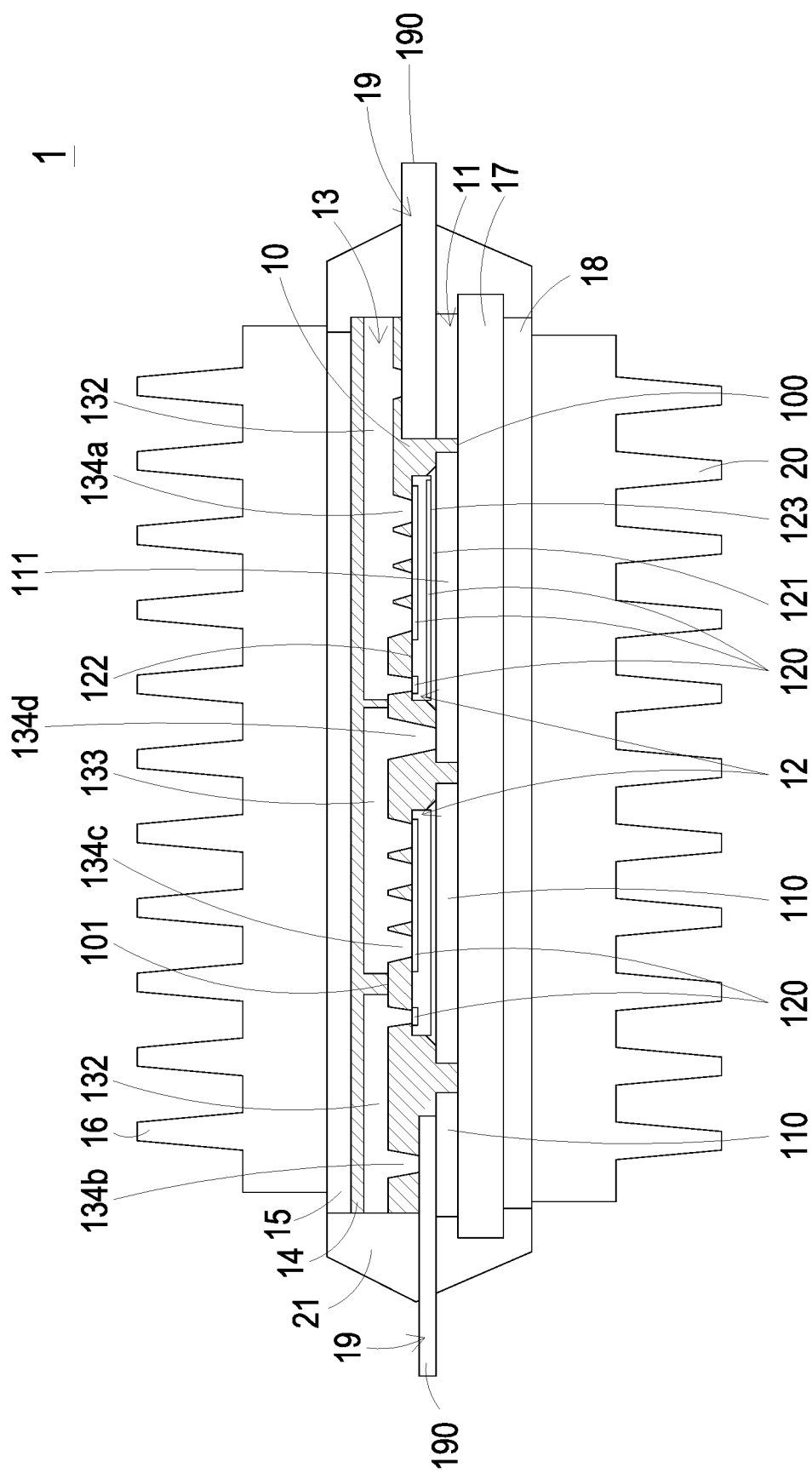
FIG. 2 is a schematic cross-sectional view illustrating a package structure according to a second embodiment of the present disclosure.

Furthermore, the at least one electronic component 12 also may include a vertical type electronic component. FIG. 2 is a schematic cross-sectional view illustrating a package structure according to a second embodiment of the present disclosure. The component parts and elements similar to those of FIG. 1 are designated by identical numeral references, and are not redundantly described herein. In comparison with the first embodiment shown in FIG. 1, at least one of the electronic components 12 may include a vertical type electronic component, such as the electronic component 12 shown on the right side of FIG. 2 and the other of the electronic components 12 may include a lateral type electronic component, such as the electronic component 12 shown on the left side of FIG. 2. At least one of the conducting terminals 120 of the vertical type electronic component 12 is formed on the second surface 123 of the vertical type electronic component 12, and the others of the conducting terminals 120 of the vertical type electronic component 12 are formed on the first surface 122 of the vertical type electronic component 12. Besides, the first redistribution structure 11 includes at least one first redistribution layer 110 and at least one second redistribution layer 111, wherein the at least one first redistribution layer 110 and the at least one second redistribution layer 111 are located in the first insulation layer 10 and exposed from the bottom surface 100 of the first insulation layer 10. Each of the two thermal conduction structures 19 and the lateral type electronic component 12 may be respectively disposed on the corresponding first redistribution layer 110 of the first redistribution structure 11, and the vertical type electronic component 12 may be disposed on the corresponding second redistribution layer 111 of the first redistribution structure 11. At least one conducting terminal 120 formed on the second surface 123 of the vertical type electronic component 12 is connected with the corresponding second redistribution layer 111 of the first redistribution structure 11. Moreover, the second redistribution structure 13 includes at least one third redistribution layer 132, at least one forth redistribution layer 133, at least one first conductive via 134a, at least one second conductive via 134b, at least one third conductive via 134c, and at least one fourth conductive via 134d. The at least one third redistribution layer 132 and the at least one forth redistribution layer 133 are disposed on a part of the top surface 101 of the first insulation layer 10. Besides, the at least one first conductive via 134a, the at least one second conductive via 134b, the at least one third conductive via 134c, and the at least one forth conductive via 134d are formed in the first insulation layer 10, wherein the at least one first conductive via 134a is in contact with the corresponding third redistribution layer 132 and connected with at least one of the corresponding conducting terminal 120 formed on the first surface 122 of the vertical type electronic component 12 and the corresponding conducting terminal 120 of the lateral type electronic component 12, the at least one second conductive via 134b is in contact with the corresponding third redistribution layer 132 and connected with the corresponding thermal conduction structure 19, the at least one third conductive via 134c is in contact with the corresponding fourth redistribution layer 133 and connected with the corresponding conducting terminal 120 of the lateral type electronic component 12, and the at least one fourth conductive via 134d is in contact with the corresponding fourth redistribution layer 133 and connected with the second redistribution layer 111. Accordingly, the thermal conduction structures 19 are electrically connected with the at least one of the conducting terminals 120 of the electronic components 12 through the first conductive via 134a, the second conductive via 134b, and the third redistribution layer 132. The at least one of the conducting terminals 120 formed on the second surface 122 of the vertical electronic component 12 is electrically connected with the at least one of the conducting terminals 120 of the lateral electronic component 12 through the third conductive via 134c, the fourth conductive via 134d, the second redistribution layer 111, and the fourth redistribution layer 133.

Figure 3:
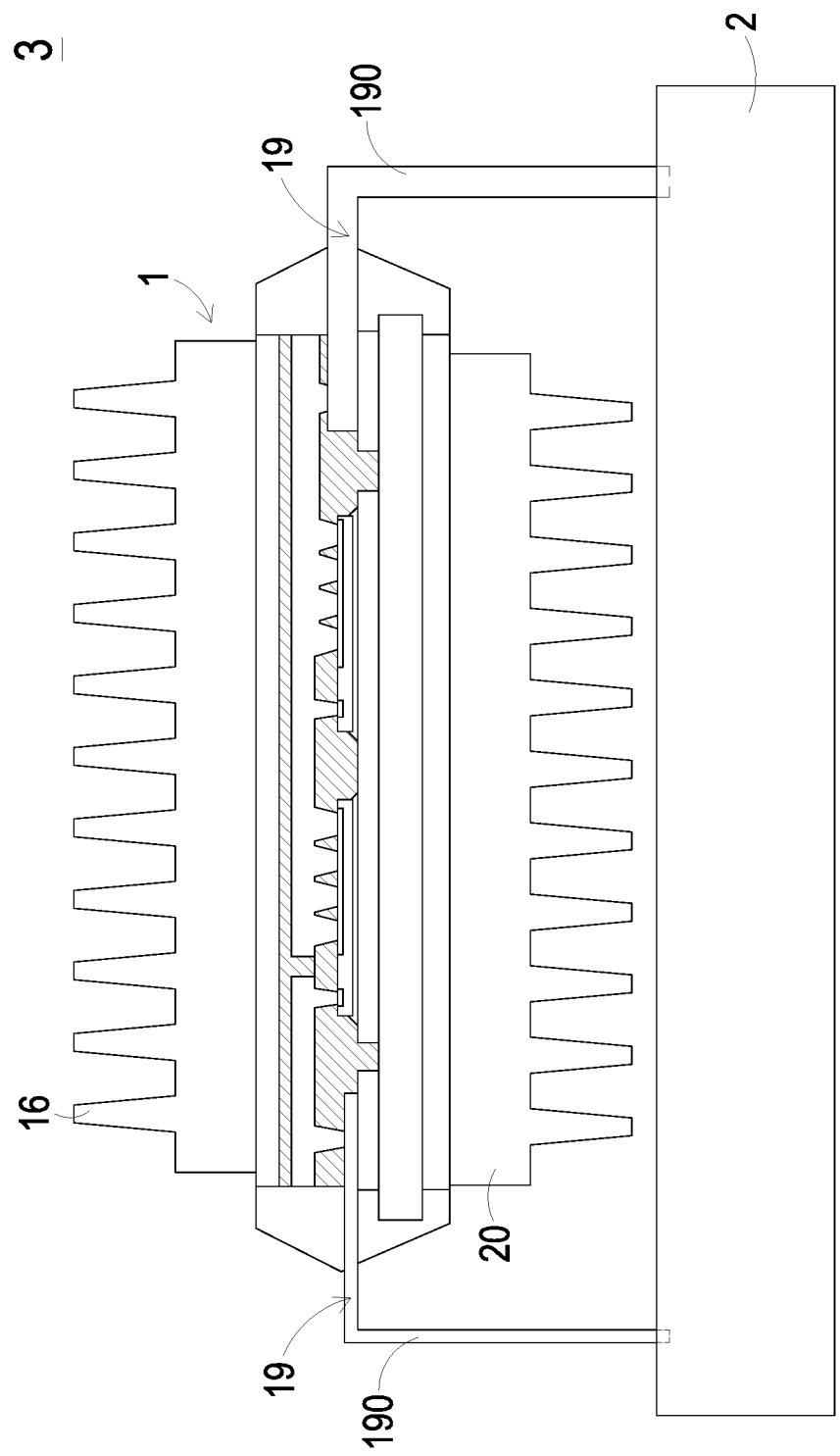
FIG. 3 is a schematic cross-sectional view illustrating a power module with the package structure of FIG. 1 according to a first embodiment of the present disclosure.

In some embodiments, the package structure 1 shown in FIG. 1 or FIG. 2 may be combined with at least one printed circuit board to form a power module. FIG. 3 is a schematic cross-sectional view illustrating a power module with the package structure 1 of FIG. 1 according to the embodiment of the present disclosure. The power module 3 includes a package structure 1 of FIG. 1 and at least one printed circuit board 2. Each pin 190 of the thermal conduction structure 19 of the package structure 1 is extended outwardly from the lateral side of the package structure 1 and bent toward the printed circuit board 2 to be inserted into an installation hole (not shown) of the printed circuit board 2, so that package structure 1 may be assembled with the at least one printed circuit board 2. Besides, each pin 190 of thermal conduction structure 19 may include for example but not limited to at least one of a press-fit-type pin and a fastener pin. In this embodiment, the package structure 1 may enhance the heat dissipating efficiency by the first heat dissipation device 16 and the second heat dissipation device 20.

Figure 4:
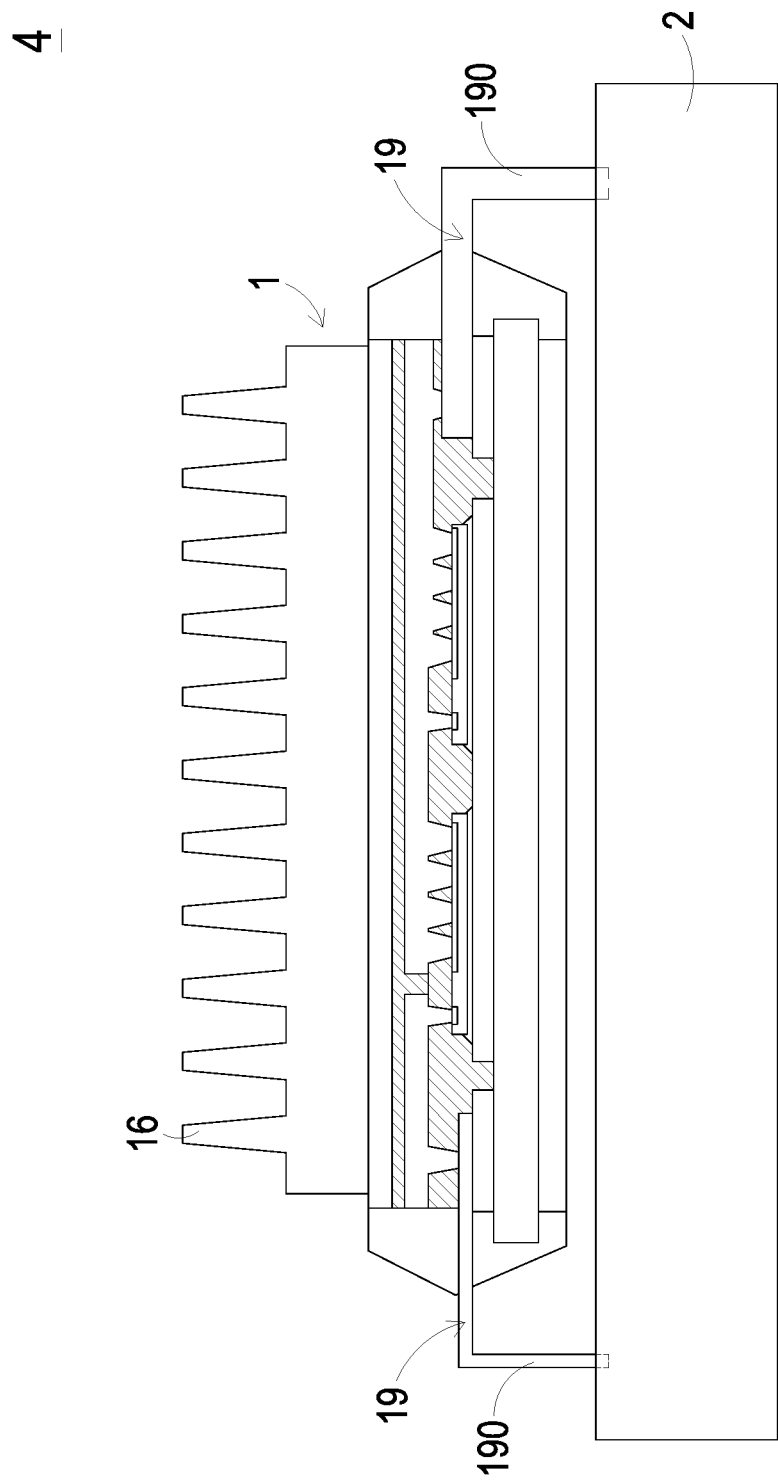
FIG. 4 is a schematic cross-sectional view illustrating a power module according to a second embodiment of the present disclosure.

FIG. 4 is a schematic cross-sectional view illustrating a power module according to a second embodiment of the present disclosure. The component parts and elements similar to those of FIG. 3 are designated by identical numeral references, and are not redundantly described herein. In comparison with the power module 3 of the first embodiment shown in FIG. 3, the power module 4 omits the second heat dissipation device 20 as shown in FIG. 3 so as to meet the space requirements between the package structure 1 and the printed circuit board 2 or the heat dissipating requirements of the package structure 1. Therefore, the thickness of the power module 4 may be reduced.

Figure 5:
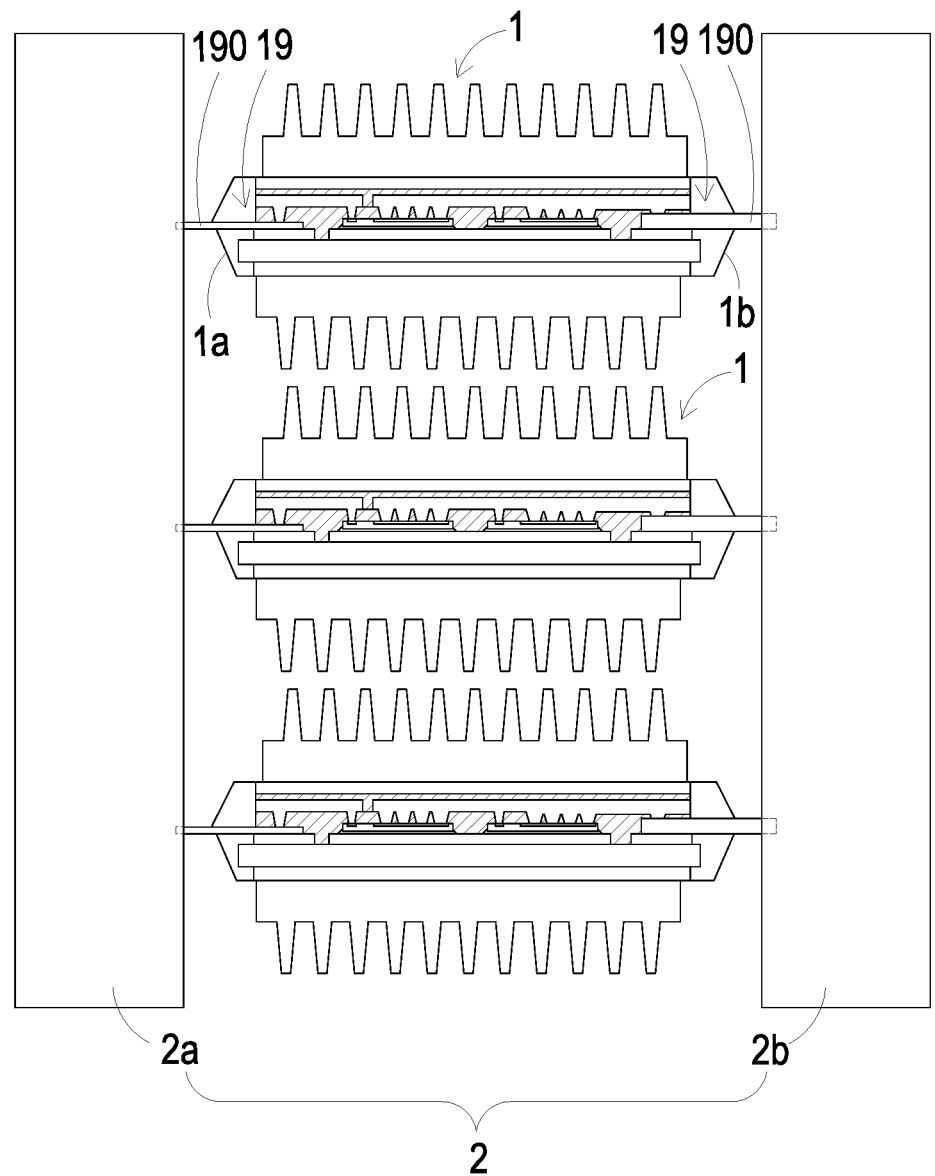
FIG. 5 is a schematic cross-sectional view illustrating a power module with plural package structures of FIG. 1 according to a third embodiment of the present disclosure.

FIG. 5 is a schematic cross-sectional view illustrating a power module with plural package structures of FIG. 1 according to a third embodiment of the present disclosure. The component parts and elements similar to those of FIG. 3 are designated by identical numeral references, and are not redundantly described herein. In this embodiment, the power module 5 includes plural package structures 1 as shown in FIG. 1 and two printed circuit boards 2 for example including a first printed circuit board 2a and a second printed circuit board 2b. The plural package structures 1 are disposed in sequence between the two printed circuit boards 2. Preferably but not exclusively, the plural package structures 1 are arranged in parallel with each other and located between the first printed circuit board 2a and the second printed circuit board 2b. The plural pins 190 of one of the package structures 1 are inserted into the two printed circuit boards 2a, 2b, respectively. In other words, each of the plural package structures 1 has a first lateral side 1a and a second lateral side 1b. The pins 190 extended outwardly from the first lateral sides 1a of the plural package structures 1 are inserted into the installation holes of the first printed circuit board 2a. The pins 190 extended outwardly from the second lateral sides 1b of the plural package structures 1 are inserted into the installation holes (not shown) of the second printed circuit board 2b. Consequently, the power module 5 can provide good scalability by employing at least two package structures 1. In some embodiments, the first heat dissipation device 16 of one package structure 1 is thermally coupled with the second heat dissipation device 20 of the other package structure 1 so that two adjacent package structures 1 may share the first heat dissipation device 16 or the second heat dissipation device 20 between the two adjacent package structures 1. In other words, the power module 5 has plural cooling channels for dissipating heat. Consequently, the heat dissipating efficacy of the power module 5 is enhanced.

Figure 6:
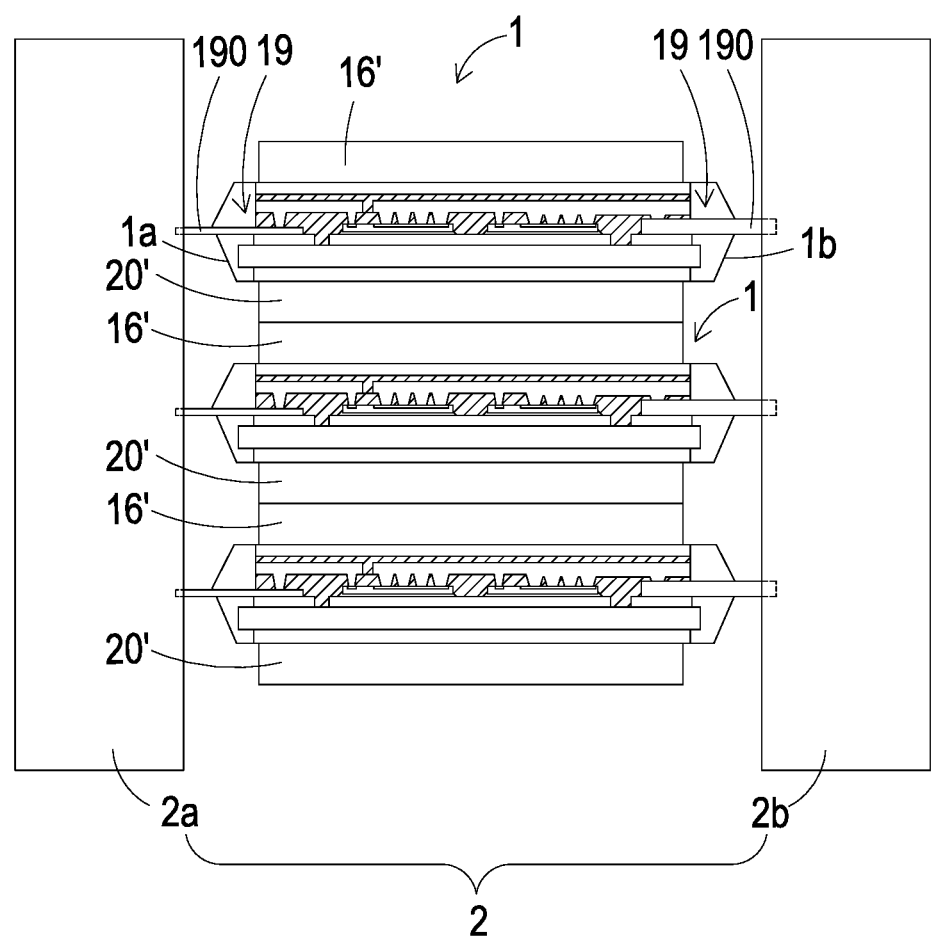
FIG. 6 is a schematic cross-sectional view illustrating a power module with plural package structure according to another embodiment of the present disclosure.

FIG. 6 is a schematic cross-sectional view illustrating a power module with plural package structure according to another embodiment of the present disclosure. The component parts and elements similar to those of FIG. 3 are designated by identical numeral references and not redundantly described herein. In this embodiment, the plural package structures 1 includes the active heat dissipation devices 16' and 20', for example water-cooling device, to replace the first heat dissipation device 16 and the second heat dissipation device 20 which are heat sinks respectively. Moreover, the active heat dissipation devices 16' of one package structure 1 is thermally coupled with the active heat dissipation devices 20' of the other package structure 1 so that two adjacent package structures 1 may share the active heat dissipation devices 16' or the active heat dissipation devices 20' between the two adjacent package structures 1. In other words, the power module 5 has plural cooling channels for dissipating heat. Consequently, the heat dissipating efficacy of the power module 5 is enhanced.

From the above descriptions, the present disclosure provides a package structure and a power module using the same. Since the first insulation layer, the first redistribution structure, the second redistribution structure, the second insulation layer, and the heat dissipation substrate respectively have high thermal conductivity, and the package structure further includes the first heat spreader, the first heat dissipation device, and the second heat spreader, even if the electronic components generate a great amount of heat during working, the heat generated by the electronic components may be rapidly dissipated to the surroundings of the package structure in the vertical direction. Besides, a part of the heat generated by the electronic components may also be rapidly and bilaterally dissipated to the surroundings of the package structure by the second redistribution structure and the thermal conduction structures. Consequently, the package structure with dual cooling function is provided and the heat dissipating efficacy of the package structure is enhanced. Besides, since plural conducting terminals of each electronic component are connected with the corresponding thermal conduction structure or the corresponding conducting terminal of the other electronic component by the first redistribution structure and/or the second redistribution structure capable of omitting the use of the wire-bonded technology, the parasitic effect may be reduced so that the efficiency of the electronic components may be enhanced, and the thickness of the package structure may be reduced. Therefore, the package structure may increase the power density to be applicable to the power module with high power.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A package structure, comprising:
    a first insulation layer;
    a first redistribution structure located in the first insulation layer and exposed from a bottom surface of the first insulation layer, wherein the first redistribution structure comprises at least one first redistribution layer;
    a second redistribution structure, wherein a part of the second redistribution structure is disposed on a part of a top surface of the first insulation layer, and the other part of the second redistribution structure is located in the first insulation layer, wherein the second redistribution structure comprises at least one second redistribution layer;
    at least one electronic component embedded within the first insulation layer, disposed on the first redistribution structure, and comprising plural conducting terminals, wherein at least one of the conducting terminals is connected with the second redistribution structure;
    a second insulation layer disposed on the other part of the top surface of the first insulating layer and the second redistribution structure;
    a first heat spreader disposed on the second insulation layer;
    a heat dissipation substrate disposed on the bottom surface of the first insulation layer;
    a second heat spreader disposed on the heat dissipation substrate; and
    plural thermal conduction structures embedded within the first insulation layer, wherein at least one of the plural thermal conduction structures is connected with at least one of the first redistribution structure and the second redistribution structure, and the plural thermal conduction structures are respectively exposed from the opposite sides of the first insulation layer to form plural pins.

2. The package structure according to claim 1, wherein the least one electronic component comprises a Wide Band Gap power semiconductor device.

3. The package structure according to claim 1, wherein the package structure further comprises at least one heat dissipation device disposed on at least one of the first heat spreader and the second heat spreader.

4. The package structure according to claim 1, wherein the package structure further comprises a molding element surrounding the first insulation layer, the first redistribution structure, the second redistribution structure, the second insulation layer, the first heat spreader, the heat dissipation substrate, and the second heat spreader to package a part of the first insulation layer, a part of the first redistribution structure, a part of the second redistribution structure, a part of the second insulation layer, a part of the first heat spreader, a part of the heat dissipation substrate, and a part of the second heat spreader, wherein the plural pins of the plural thermal conduction structures are respectively extended outwardly along a horizontal direction from the molding element.

5. The package structure according to claim 1, wherein one of the plural thermal conduction structures is thinner than the other of the plural thermal conduction structures, the thinner one of the plural thermal conduction structures is adapted to be a signal path, and the thicker one of the plural thermal conduction structures is adapted to be at least one of a high current path and a high voltage path.

6. The package structure according to claim 1, wherein the at least one electronic component comprises a first electronic component, and the plural conducting terminals of the first electronic component are formed on a first surface of the first electronic component.

7. The package structure according to claim 6, wherein the at least one first redistribution layer is located in the first insulation layer and exposed from the bottom surface of the first insulation layer, the first electronic component is attached on the corresponding first redistribution layer through a fixing material, and each of the plural thermal conduction structures is disposed on the corresponding first redistribution layer.

8. The package structure according to claim 6, wherein the second redistribution structure comprises:
    the at least one second redistribution layer disposed on a part of the top surface of the first insulation layer;
    at least one first conductive via formed in the first insulation layer, wherein the at least one first conductive via is in contact with the corresponding second redistribution layer and connected with the corresponding conducting terminal of the first electronic component; and
    at least one second conductive via formed in the first insulation layer, wherein the at least one second conductive via is in contact with the corresponding second redistribution layer and connected with the corresponding thermal conduction structure.

9. The package structure according to claim 1, wherein the at least one electronic component comprises at least one second electronic component and at least one first electronic component, wherein the plural conducting terminals of the first electronic component are formed on a first surface of the first electronic component, at least one of the plural conducting terminals of the second electronic component is formed on a second surface of the second electronic component, and the others of the plural conducting terminals of the second electronic component are formed on a first surface of the second electronic component.

10. The package structure according to claim 9, wherein the first redistribution structure comprises:
    the at least one first redistribution layer located in the first insulation layer and exposed from the bottom surface of the first insulation layer; and
    at least one second redistribution layer, wherein the at least one second redistribution layer of the first redistribution structure is located in the first insulation layer and exposed from the bottom surface of the first insulation layer.

11. The package structure according to claim 10, wherein at least one of the plural thermal conduction structures and the at least one first electronic component are respectively disposed on the corresponding first redistribution layer, and the at least one second electronic component is disposed on the corresponding second redistribution layer.

12. The package structure according to claim 11, wherein the second redistribution structure comprises:
- at least one third redistribution layer disposed on a part of the top surface of the first insulation layer;
- at least one fourth redistribution layer disposed on a part of the top surface of the first insulation layer;
- at least one first conductive via formed in the first insulation layer, wherein the at least one first conductive via is in contact with the corresponding third redistribution layer and connected with at least one of the corresponding conducting terminal formed on the first surface of the second electronic component and the corresponding conducting terminal formed on the first electronic component;
- at least one second conductive via formed in the first insulation layer, wherein the at least one second conductive via is in contact with the corresponding third redistribution layer and connected with the corresponding thermal conduction structure;
- at least one third conductive via formed in the first insulation layer, wherein the at least one third conductive via is in contact with the corresponding fourth redistribution layer and connected with the corresponding conducting terminal of the first electronic component; and
- at least one fourth conductive via formed in the first insulation layer, wherein the at least one fourth conductive via is in contact with the corresponding fourth redistribution layer and connected with the second redistribution layer of the first redistribution structure.

13. A power module, comprising:
- at least one printed circuit board; and
- at least one package structure, comprising:
  - a first insulation layer;
  - a first redistribution structure located in the first insulation layer and exposed from a bottom surface of the first insulation layer;
  - a second redistribution structure, wherein a part of the second redistribution structure is disposed on a part of a top surface of the first insulation layer, and the other part of the second redistribution structure is located in the first insulation layer;
  - at least one electronic component embedded within the first insulation layer, disposed on the first redistribution structure, and comprising plural conducting terminals, wherein at least one of the plural conducting terminals is connected with the second redistribution structure;
  - a second insulation layer disposed on the other part of the top surface of the first insulating layer and the second redistribution structure;
  - a first heat spreader disposed on the second insulation layer;
  - a heat dissipation substrate disposed on the bottom surface of the first insulation layer;
  - a second heat spreader disposed on the heat dissipation substrate; and
  - plural thermal conduction structures embedded within the first insulation layer, wherein at least one of the plural thermal conduction structures is connected with at least one of the first redistribution structure and the second redistribution structure, and the plural thermal conduction structures are respectively extended outwardly along a horizontal direction from the opposite sides of the first insulation layer to form plural pins to be inserted into the at least one printed circuit board.

14. The power module according to claim 13, wherein the plural pins are extended outwardly along a horizontal direction from the package structure and bent toward the at least one printed circuit board to be inserted into the at least one printed circuit board.

15. The power module according to claim 14, wherein the at least one of the pins comprises at least one of a press-fit-type pin and a fastener pin.

16. The power module according to claim 14, wherein the at least one the package structure comprises plural package structures, and at least one printed circuit board comprises two printed circuit boards, wherein the plural package structures are arranged in parallel with each other and located between the two printed circuit boards, wherein the plural pins of one of the package structures are inserted into the two printed circuit boards, respectively.

17. The power module according to claim 13, wherein the least one electronic component comprises a Wide Band Gap power semiconductor device.

18. The power module according to claim 13, wherein the at least one package further comprises a molding element surrounding the first insulation layer, the first redistribution structure, the second redistribution structure, the second insulation layer, the first heat spreader, the heat dissipation substrate, and the second heat spreader to package a part of the first insulation layer, a part of the first redistribution structure, a part of the second redistribution structure, a part of the second insulation layer, a part of the first heat spreader, a part of the heat dissipation substrate, and a part of the second heat spreader, wherein the plural pins of the plural thermal conduction structures are respectively extended outwardly along a horizontal direction from the molding element.

19. The power module according to claim 13, wherein one of the plural thermal conduction structures is thinner than the other of the plural thermal conduction structures, the thinner one of the plural thermal conduction structures is configured to be a signal path, and the thicker one of the plural thermal conduction structures is configured to be at least one of a high current path and a high voltage path.

20. The power module according to claim 13, wherein the at least one electronic component comprises at least one second electronic component and at least one first electronic component, wherein the plural conducting terminals of the first electronic component are formed on a first surface of the first electronic component, at least one of the plural conducting terminals of the second electronic component is formed on a second surface of the second electronic component, and the others of the plural conducting terminals of the second electronic component are formed on a first surface of the second electronic component.

* * * * *